United States Patent
Zacherl et al.

(10) Patent No.: US 7,384,822 B2
(45) Date of Patent: Jun. 10, 2008

(54) PACKAGE FOR SEMICONDUCTOR COMPONENTS AND METHOD FOR PRODUCING THE SAME

(75) Inventors: Juergen Zacherl, Donaustauf (DE); Stephan Blaszczak, Freyburg (DE); Martin Reiss, Dresden (DE); Sylke Ludewig, Dresden (DE)

(73) Assignee: Infineon Technologies AG, Munich (DE)

(*) Notice: Subject to any disclaimer, the term of this patent is extended or adjusted under 35 U.S.C. 154(b) by 377 days.

(21) Appl. No.: 10/518,141

(22) PCT Filed: Jun. 10, 2003

(86) PCT No.: PCT/DE03/01925

§ 371 (c)(1),
(2), (4) Date: Oct. 7, 2005

(87) PCT Pub. No.: WO03/107417

PCT Pub. Date: Dec. 24, 2003

(65) Prior Publication Data

US 2006/0138632 A1    Jun. 29, 2006

(30) Foreign Application Priority Data

Jun. 17, 2002    (DE) .................... 102 27 059

(51) Int. Cl.
*H01L 21/48* (2006.01)
(52) U.S. Cl. .................. 438/127; 257/E23.116; 257/E21.502

(58) Field of Classification Search ........ 257/E23.116, 257/E23.125, E23.127, E23.129, E21.499, 257/E21.502
See application file for complete search history.

(56) References Cited

U.S. PATENT DOCUMENTS

| 6,107,679 A | 8/2000 | Noguchi |
| 2001/0026959 A1 | 10/2001 | Jimarez et al. |
| 2002/0028525 A1 | 3/2002 | Sakamoto et al. |

FOREIGN PATENT DOCUMENTS

JP    2178953    7/1990

*Primary Examiner*—Scott B. Geyer
(74) *Attorney, Agent, or Firm*—Slater & Matsil, L.L.P.

(57) ABSTRACT

The invention relates to a packaging for semiconductor components such as FBGA packages in BOC technology or the like, wherein at least the back and the lateral edges of a chip (2) mounted on a substrate are enclosed by a mold coating (6), the casting compound used for the mold coating (6) being linked with the substrate and forming an integrated whole therewith. The invention further relates to a method for producing such a packaging for semiconductor components. The aim of the invention is to provide a packaging for semiconductor components which is characterized by reduced thermomechanical stress and at the same time a substantially improved adhesion of the mold coating to the substrate, thereby allowing for a higher package load. According to the invention, this aim is achieved in that the substrate (1), at least in some areas, has a spongy structure (7) that is provided with pore-type openings and that extends from the surface to the depths of the structure so that the molding material penetrates the substrate (1) by capillary attraction.

20 Claims, 3 Drawing Sheets

PACKAGE FOR SEMICONDUCTOR COMPONENTS AND METHOD FOR PRODUCING THE SAME

CROSS-REFERENCE TO RELATED APPLICATIONS

The present application is based on International application No. PCT/DE03/01925, filed on Jun. 10, 2003, which in turn corresponds to DE 102 27 059.7 filed on Jun. 17, 2002, and which priority is hereby claimed under 35 USC § 119 based on these applications. Each of these applications are hereby incorporated by reference in their entirety into the present application.

TECHNICAL FIELD

The invention relates to a package for semiconductor components, such as FBGA packages in BOC technology or the like, in which at least the rear side and the side edges of a chip mounted on a substrate are enclosed by a molding covering, the potting compound used for the molding covering being connected to the substrate, in a manner forming a compact unit. The invention furthermore relates to a method for producing such a package for semiconductor components.

BACKGROUND

In a series of components such as BOC components or else in CSP (Chip Size Package) components, FBGA (Fine Pitch Ball Grid Array), TBGA (Tape Ball Grid Array) or μBGA components or the like, the chips are mounted on substrates whose dimensions approximately correspond to those of the chips to be mounted. The various designations are in part manufacturer-typical indications and identify differences or subtleties in the structural design. In the interests of a structural height that is as small as possible, in some components the chip rear sides are not covered, rather at most merely the particularly sensitive chip edges are enclosed by a molding compound. This last is effected by dispensing a suitable molding compound (potting compound) around the chip edges. If the chip rear side is also to be concomitantly protected in addition, it is necessary to use complicated printing or casting methods. It goes without saying that the different materials used for the substrate, the chip and the potting compound have in some instances considerably different mechanical properties and, in particular, different thermal expansion coefficients. For the substrate, use is made of the customary printed circuit board materials, such as hard paper or glass fiber materials, in which synthetic resin is usually used as a binder.

Examples of such semiconductor components are found in U.S. Pat. No. 5,391,916 A, which describes a semiconductor component provided with a potting compound, or in U.S. Pat. No. 5,293,067 A, which describes a special chip carrier for a chip on board (COB) component in order to reduce the mechanical stress.

Through suitable material selection, the expansion coefficients can be co-ordinated with one another in a certain way such that the difference in the expansion coefficients between the respective material pairing becomes as small as possible.

However, there is virtually no possibility of complete matching. This has the fatal consequence, particularly in the case of BOC or COB components, that the latter, if they are protected with an additional molding covering, are subjected to an extreme stress during normal use. This stress is essentially based on the "bimetal effect", which results when different materials having different expansion coefficients are joined together in layers.

In order at least to reduce the stress between the substrate and the chip, the mounting thereof on the substrate is usually effected with the interposition of a tape that compensates for thermal stresses. In any event, there are then still significant differences in the respective expansion coefficients between the material pairings of Si chip/molding compound and molding compound/substrate that are directly in contact with one another. In the worst-case situation, this may result in a separation of the connection and thus possibly the total failure of the component.

As already mentioned in the introduction, various complicated methods have hitherto been carried out for protecting the chips. Thus, by way of example, dispensing, in order to protect the particularly sensitive chip edges, or printing or molding, in order to achieve a complete protection of the chip including the rear side thereof. However, it has not been possible to eliminate, or eliminate sufficiently, the effects of the thermomechanical stresses between the material pairings, so that stress-dictated component failures always have to be reckoned with. However, solution approaches such as material and design changes and a tape underlay have caused other problems, such as uncovered fuses.

SUMMARY

Therefore, the invention is based on the object of providing a package for semiconductor components which achieves a significantly higher package loading through lower thermomechanical stress and, at the same time, a significantly better adhesion of the molding covering on the substrate.

In the case of a package of the type mentioned in the introduction, the object on which the invention is based is achieved by virtue of the fact that the substrate has, at least partially, a sponge-like structure which is provided with porous openings and extends from the surface into the depth, so that molding material can penetrate into the substrate through capillary action.

This particularly simple solution enables the expansion coefficient of the printed circuit board material to be largely matched to the expansion coefficient of the molding material. As a result, stresses are applied uniformly to the fracture-sensitive semiconductor chip from all sides and said semiconductor chip can no longer flex only in a preferred direction. A further advantage is to be seen in the fact that higher package loadings are made possible by virtue of the lower stress.

Furthermore, the invention achieves a significantly higher adhesion of the covering material on the substrate since the two materials grow together to a certain extent.

In order that the production of the substrate according to the invention is configured as cost-effectively as possible, the entire surface of the substrate has a sponge-like structure.

It is also possible, of course, for the substrate in its entirety to have a sponge-like structure. This means that a particularly large amount of molding material can penetrate into the substrate, with the result that a particularly good adaptation of the thermal expansion coefficients is achieved.

The sponge-like structure may be produced in a simple manner by partial removal of the epoxy resin portion in the substrate, by using wet or dry etching methods.

In order to restrict the wet or dry etching to specific regions of the substrate, the latter may be partially covered with a soldering resist mask.

It is also possible to produce the sponge-like structure by mechanical surface processing of the substrate. In this case, however, the sponge-like region would be limited only to the substrate region directly near the surface.

In order to achieve the deepest possible penetration of the molding material into the substrate, the structure, comprising the semiconductor chip finally mounted on the substrate, is preheated at least to the melting point of the molding compound before the application of the molding covering.

As an alternative or in addition the structure, comprising the semiconductor chip finally mounted on the substrate, may be briefly subjected to heat treatment after the application of the molding covering.

The heat treatment is preferably performed at a temperature around the melting point of the molding compound, or slightly above the melting point, in order to achieve a maximum penetration depth.

A particular refinement of the invention is characterized in that, before the mounting of the chip, the substrate is partially coated with a thin layer of molding compound and subjected to heat treatment at a temperature around or above the melting point. The molding compound may be applied in a simple manner by printing or dispensing. The heat treatment operation may be performed either directly after the application of the molding compound, or after the application of the molding covering after the conclusion of the mounting operation.

This refinement of the invention has the advantage that the substrates can be pretreated without influencing the technological sequence of the mounting operation.

BRIEF DESCRIPTION OF THE DRAWINGS

The invention will be explained in more detail below using an exemplary embodiment. In the associated drawings:

In order that the mode of action of the invention can be illustrated well, the structural design of a customary BOC component will be described first of all. FIG. 1 shows such a BOC component constructed according to the prior art in a diagrammatic illustration. The basis for this component is formed by a substrate 1 comprising the customary printed circuit board materials, such as hard paper or glass fiber materials, in the case of which synthetic resin has usually been used as binder.

Figure 1:
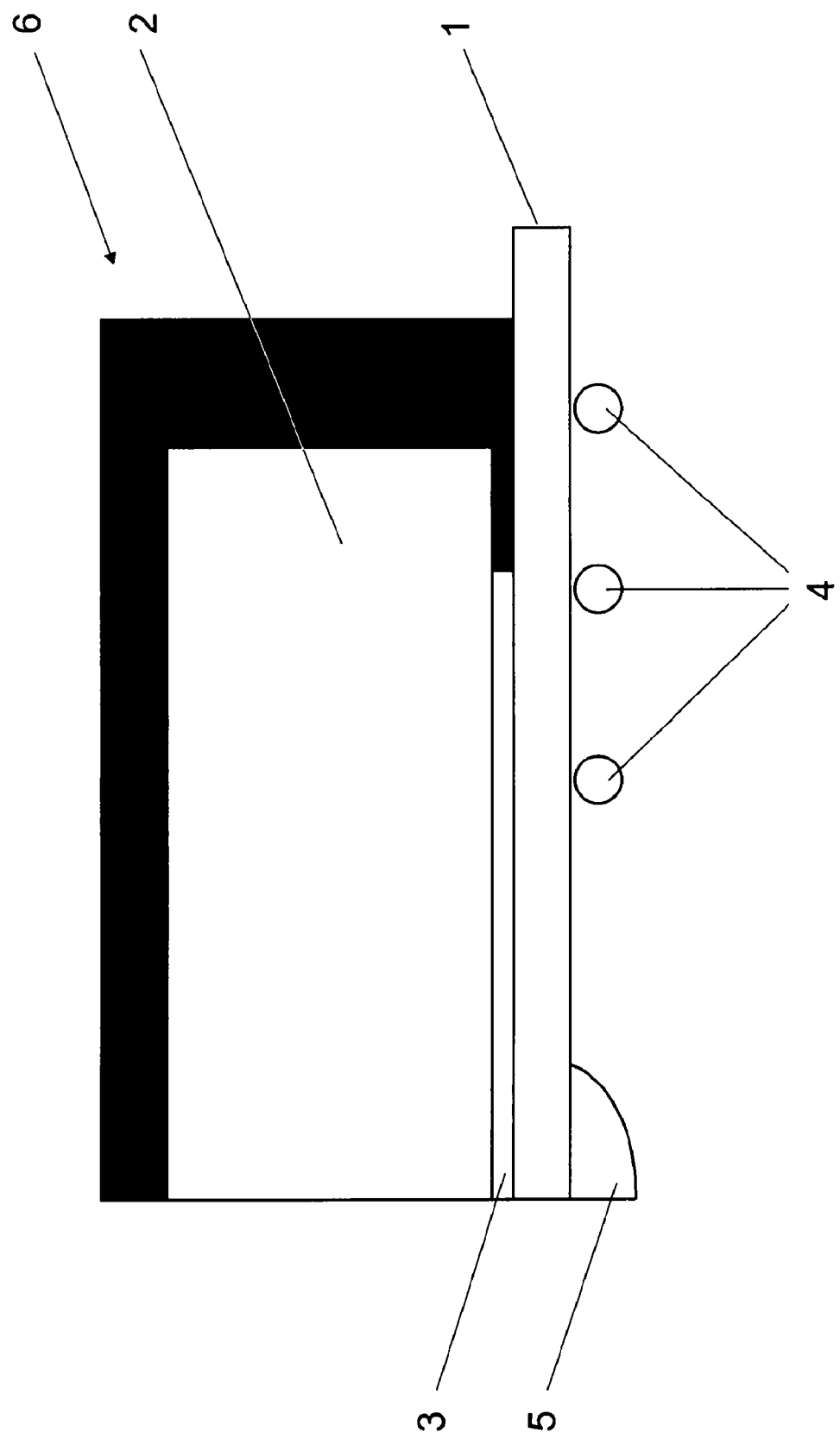
FIG. 1 shows a diagrammatic sectional illustration of a BOC component (prior art)

A chip 2 is die-bonded on this substrate 1 with the interposition of a tape 3. The underside of the substrate 1 is provided with conductive tracks (not illustrated) which are connected, on the one hand, to solder balls 4, and, on the other hand, to the chip 2 via customary microwires (not illustrated) which run through a central channel in the substrate 1. This central channel is closed with a bonding channel closure 5 made of a molding material (potting compound) in order to protect the microwires and the active side of the chip 2. The rear side of the chip 2 (at the top in FIG. 1) and the chip edges are enclosed by a molding covering 6, the molding covering 6 being connected to the surface of the substrate 1 by adhesion laterally with respect to the chip 2. The molding covering can be produced by printing or dispensing.

Such a component, then, exhibits the disadvantages described in the introduction on account of the different expansion coefficients and mechanical properties of the individual components which are directly in contact with one another. This forms the starting point for the invention.

Figure 2:
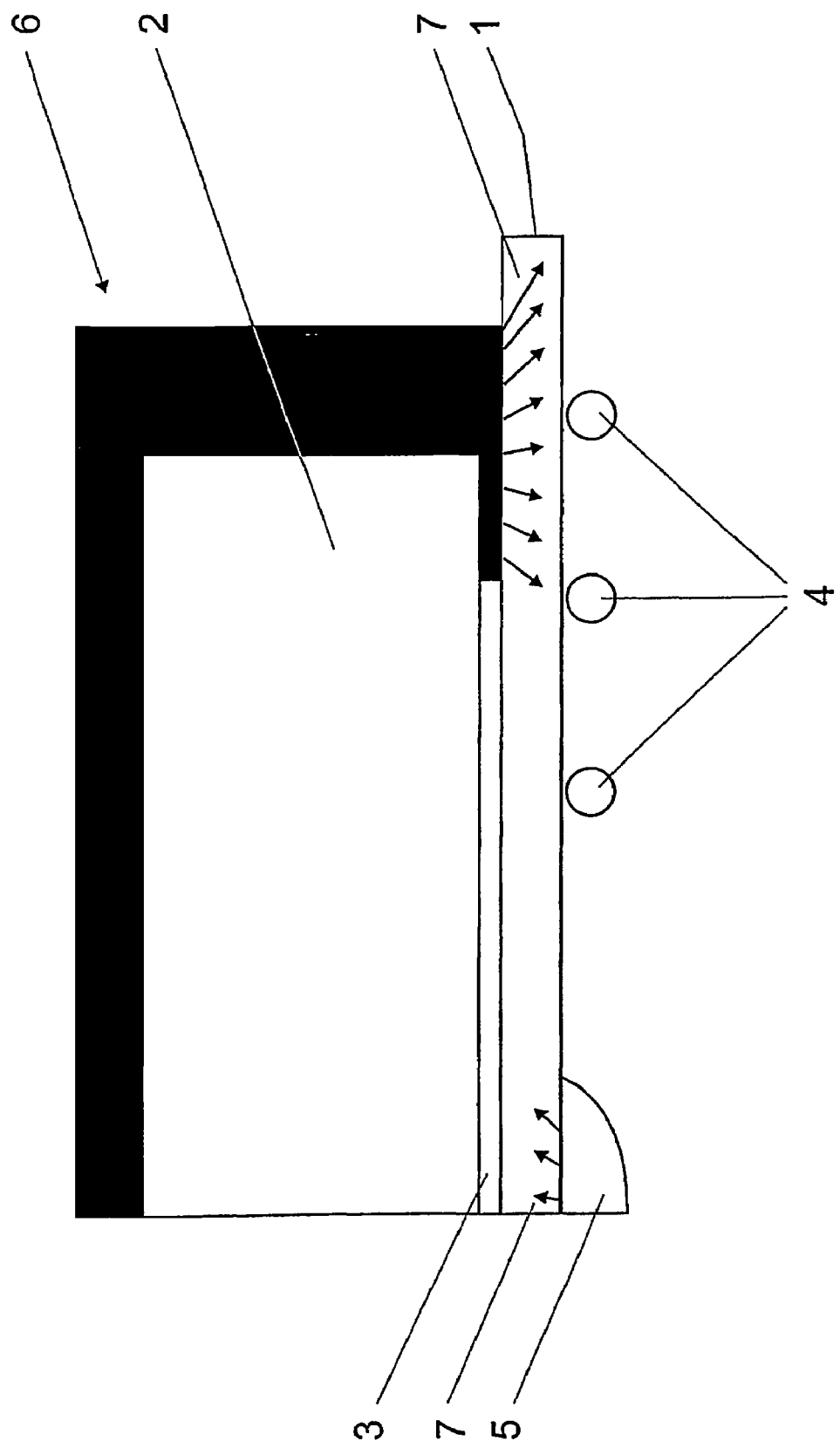
FIG. 2 shows a diagrammatic illustration of a package according to the invention for a BOC component.

In order to achieve an extensive matching of the expansion components of the molding material and of the substrate and a significant improvement in the adhesion force between molding compound and substrate 1, the substrate 1 is pretreated in such a way that at least its region near the surface acquires a sponge-like structure which extends into the depth and into which the molding material can penetrate during molding. This state is illustrated in FIG. 2.

The sponge-like structure 7 of the substrate 1 can be produced by partial removal of the epoxy resin portion, by using wet or dry etching methods. This wet or dry etching may be restricted, as required, to specific regions of the substrate 1 by said regions being partially covered with a soldering resist mask.

It goes without saying that the sponge-like structure 7 can also be produced by mechanical surface processing of the substrate, in which case, however, the sponge-like region would be limited only to the region of the substrate 1 that is directly near the surface. In any event, here at least one transition region is produced and a significant improvement in the adhesion force of the molding material on the substrate is achieved.

Instead of the subsequent processing of the substrate 1, it is also possible, of course, to use a substrate 1 which already acquired a sponge-like structure in the course of its production. Such substrates may also comprise a sintering material in which cavities are produced after sintering by annealing. This can be realized in a simple manner by carbon-containing particles of a suitable size being admixed with the sintering material. These particles then burn during annealing and produce the desired cavities in the substrate 1.

In order to achieve the deepest possible penetration of the molding material into the sponge-like structure 7 of the substrate 1, the structure, comprising the chip 2 finally mounted on the substrate 1, is preheated at least to the melting point of the molding compound before the application of the molding covering 6. As an alternative or in addition, the assembly may be subjected to heat treatment after the application of the molding covering 6 at a temperature around the melting point of the molding compound or slightly above it.

Figure 3:
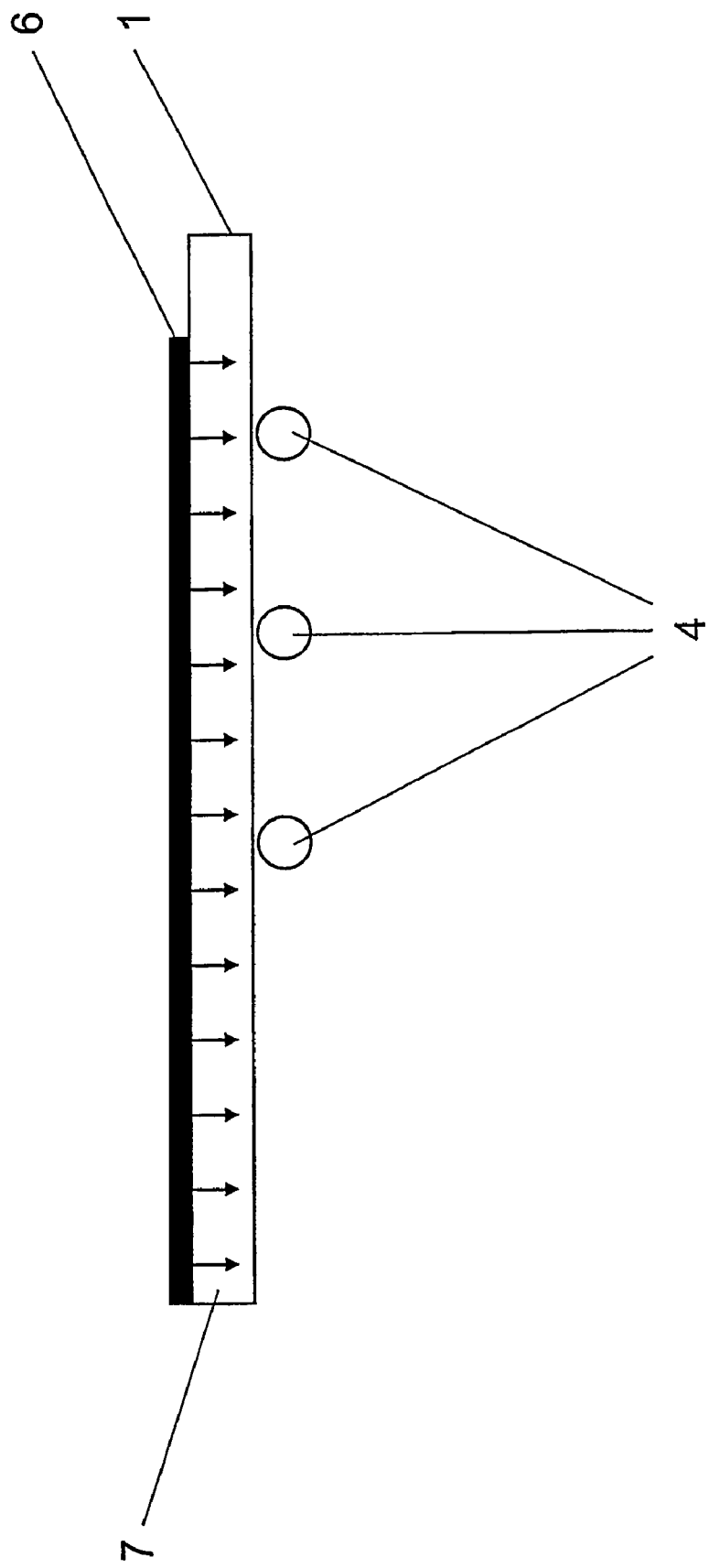
FIG. 3 shows a substrate which has been partially coated with a molding compound and subjected to heat treatment.

In an alternative, before the mounting of the chip 2, the substrate 1 is partially coated with a thin layer of molding compound and subjected to heat treatment at a temperature around or above the melting point of the molding compound (FIG. 3). The application of the molding compound to the substrate 1 can be effected in a simple manner by printing or dispensing. The expedient heat treatment operation may be performed either directly after the application of the molding compound, or after the application of the molding covering 6 after the conclusion of the mounting operation.

This refinement of the invention has the advantage that the substrates can be pretreated without influencing the technological sequence of the mounting operation.

LIST OF REFERENCE SYMBOLS

1 Substrate
2 Chip
3 Tape
4 Solder ball
5 Bonding channel closure
6 Molding covering
7 Sponge-like structure

The invention claimed is:

1. A packaged semiconductor component comprising:
a substrate; and
a chip mounted on the substrate, wherein at least a rear side and side edges of the chip are enclosed by a molding covering, molding material used for the molding covering being connected to the substrate in a manner forming a compact unit;
wherein the substrate includes a sponge-like structure that is provided with porous openings that extend from a surface to a depth, such that the molding material penetrates into the substrate.

2. The packaged semiconductor component as claimed in claim 1 wherein the molding material penetrates into the substrate through capillary action.

3. The packaged semiconductor component as claimed in claim 1, wherein the chip is mounted on an upper surface of the substrate and wherein the entire upper surface of the substrate includes the sponge-like structure.

4. The packaged semiconductor component as claimed in claim 3, wherein all surfaces of the substrate include the sponge-like structure.

5. The packaged semiconductor component as claimed in claim 1, wherein the sponge-like structure has been produced by partial removal of an epoxy resin portion in the substrate.

6. The packaged semiconductor component as claimed in claim 5, wherein the sponge-like structure has been produced by wet or dry etching.

7. The packaged semiconductor component as claimed in claim 5, wherein the substrate is partially covered with a soldering resist mask.

8. The packaged semiconductor component as claimed in claim 1, wherein the sponge-like structure has been produced by mechanical surface processing of the substrate.

9. A method for producing a packaged electronic component, the method comprising:
providing a package substrate;
modifying the package substrate to create a sponge-like structure over at least a portion of an upper surface of the package substrate;
mounting an electronic component on the upper surface of the package substrate; and
applying a molding material to enclose at least side edges of the chip such that portions of the molding material penetrate into the sponge-like structure of the package substrate.

10. The method as claimed in claim 9 wherein the molding material penetrates into the sponge-like structure of the package substrate through capillary action.

11. The method as claimed in claim 9, wherein the entire upper surface of the package substrate is modified to include the sponge-like structure.

12. The method as claimed in claim 11, wherein all surfaces of the package substrate are modified to include the sponge-like structure.

13. The method as claimed in claim 9, wherein modifying the package substrate comprises producing the sponge-like structure by partial removal of an epoxy resin portion in the substrate.

14. The method as claimed in claim 9, wherein modifying the package substrate comprises performing a wet or dry etch.

15. The method as claimed in claim 9, wherein modifying the package substrate comprises performing a mechanical surface processing of the substrate.

16. The method as claimed in claim 9, wherein, after mounting the electronic component, the package substrate and the electronic component are preheated at least to the melting point of the molding compound before the application of the molding material.

17. The method as claimed in claim 9, wherein the electronic component, the package substrate and the molding material are subjected to heat treatment after the application of the molding material.

18. The method as claimed in claim 17, wherein the heat treatment is effected at a temperature around the melting point of the molding material.

19. The method as claimed in claim 9, wherein, before the mounting the electronic component, the package substrate is partially coated with a thin layer of molding compound and subjected to heat treatment at a temperature around or above the melting point of the molding material.

20. The method as claimed in claim 19, wherein the molding material is printed or dispensed onto the substrate.

* * * * *